(12) United States Patent
Kunert et al.

(10) Patent No.: US 10,566,250 B2
(45) Date of Patent: Feb. 18, 2020

(54) HIGH ASPECT RATIO CHANNEL SEMICONDUCTOR DEVICE AND METHOD OF MANUFACTURING SAME

(71) Applicant: IMEC vzw, Leuven (BE)

(72) Inventors: Bernardette Kunert, Wilsele (BE);
Niamh Waldron, Heverlee (BE);
Weiming Guo, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/271,626

(22) Filed: Feb. 8, 2019

(65) Prior Publication Data

US 2019/0244862 A1 Aug. 8, 2019

Related U.S. Application Data

(62) Division of application No. 15/713,417, filed on Sep. 22, 2017, now Pat. No. 10,224,250.

(30) Foreign Application Priority Data

Sep. 22, 2016 (EP) ..................................... 16190164

(51) Int. Cl.
*H01L 29/66* (2006.01)
*H01L 21/8258* (2006.01)
(Continued)

(52) U.S. Cl.
CPC ...... *H01L 21/8258* (2013.01); *H01L 21/8252* (2013.01); *H01L 21/823487* (2013.01);
(Continued)

(58) Field of Classification Search
CPC ......... H01L 21/823487; H01L 21/8252; H01L 21/8258; H01L 21/84; H01L 21/845;
(Continued)

(56) References Cited

U.S. PATENT DOCUMENTS 8,716,156 B1 5/2014 Pawlak et al.
9,087,900 B1 7/2015 Kim
(Continued)

FOREIGN PATENT DOCUMENTS

WO  WO 2014/209398  12/2014
WO  WO 2015/099689  7/2015

OTHER PUBLICATIONS

Czornomaz, L. et al., "Co-integrating high mobility channels for future CMOS, from substrate to circuits", paper Th-D2-1—*IEEE 26th Int. Conf. on Indium Phosphide and Related Materials* (Montpellier, France, May 11-15, 2014); 2 pages; 2014.
(Continued)

*Primary Examiner* — Shahed Ahmed
(74) *Attorney, Agent, or Firm* — Knobbe, Martens, Olson & Bear LLP

(57) ABSTRACT

The disclosed technology generally relates to semiconductor devices, and more specifically to a semiconductor device having a high aspect ratio channel layer. In one aspect, semiconductor device includes a semiconductor substrate having formed thereon a dielectric isolation layer having an opening formed therethrough. The semiconductor device additionally includes a filling isolation structure having a portion formed in the opening and a portion protruding above the dielectric isolation layer, wherein the filling isolation structure comprises a dielectric filling layer. The semiconductor device additionally includes a dielectric layer formed on the dielectric isolation layer, wherein the dielectric layer and the dielectric filling layer have top surfaces that are substantially co-planar to form a common top surface. The semiconductor device further includes a first vertical channel layer laterally interposed between and in contact with the dielectric layer and the dielectric filling layer at a first side of the dielectric filling layer, wherein the
(Continued)

first vertical channel layer extends above the common top surface.

14 Claims, 14 Drawing Sheets

(51) Int. Cl.
*H01L 21/84* (2006.01)
*H01L 29/78* (2006.01)
*H01L 29/786* (2006.01)
*H01L 21/8234* (2006.01)
*H01L 21/8252* (2006.01)
*H01L 27/12* (2006.01)
*H01L 29/423* (2006.01)

(52) U.S. Cl.
CPC ............ *H01L 21/84* (2013.01); *H01L 21/845* (2013.01); *H01L 27/1203* (2013.01); *H01L 29/66742* (2013.01); *H01L 29/66795* (2013.01); *H01L 29/785* (2013.01); *H01L 29/78642* (2013.01); *H01L 29/42392* (2013.01); *H01L 29/66522* (2013.01); *H01L 29/66666* (2013.01); *H01L 29/7827* (2013.01)

(58) Field of Classification Search
CPC .......... H01L 27/1203; H01L 29/66742; H01L 29/66795; H01L 29/785; H01L 29/78642; H01L 29/42392; H01L 29/66522; H01L 29/66666; H01L 29/7827
See application file for complete search history.

(56) References Cited

U.S. PATENT DOCUMENTS

| | | |
|---|---|---|
| 9,431,425 B1 | 8/2016 | Cheng et al. |
| 2009/0289304 A1 | 11/2009 | Pouydebasque et al. |
| 2010/0308414 A1 | 12/2010 | Dixit |
| 2013/0037869 A1 | 2/2013 | Okano |
| 2014/0175512 A1 | 6/2014 | Chu-Kung et al. |
| 2015/0041958 A1 | 2/2015 | Cheng et al. |
| 2015/0132920 A1 | 5/2015 | Vellianitis et al. |
| 2015/0236086 A1 | 8/2015 | Colinge |
| 2015/0255300 A1 | 9/2015 | He et al. |
| 2015/0263045 A1 | 9/2015 | Leobandung |
| 2015/0287595 A1 | 10/2015 | Wei et al. |
| 2015/0303218 A1 | 10/2015 | Loubet et al. |
| 2016/0005834 A1 | 1/2016 | Pawlak et al. |
| 2016/0093611 A1 | 3/2016 | Cheng |
| 2016/0204037 A1* | 7/2016 | Goel .................... H01L 29/267 438/429 |
| 2017/0054027 A1 | 2/2017 | Liu |
| 2017/0117377 A1 | 4/2017 | Colinge |
| 2017/0256408 A1* | 9/2017 | Mukherjee ........ H01L 21/02516 |
| 2017/0358645 A1* | 12/2017 | Dewey ............. H01L 29/66469 |
| 2017/0365692 A1* | 12/2017 | Leobandung ..... H01L 29/66795 |
| 2018/0090579 A1 | 3/2018 | Cheng |
| 2018/0114851 A1 | 4/2018 | Balakrishnan |

OTHER PUBLICATIONS

Daix, N. et al., "Towards large size substrates for III-V co-integration made by direct wafer bonding on Si", *APL Materials*, 2, 086104, 7 pages, 2014.

European Search Report Received in European Patent Application No. 16190164.0, dated Mar. 20, 2017.

* cited by examiner

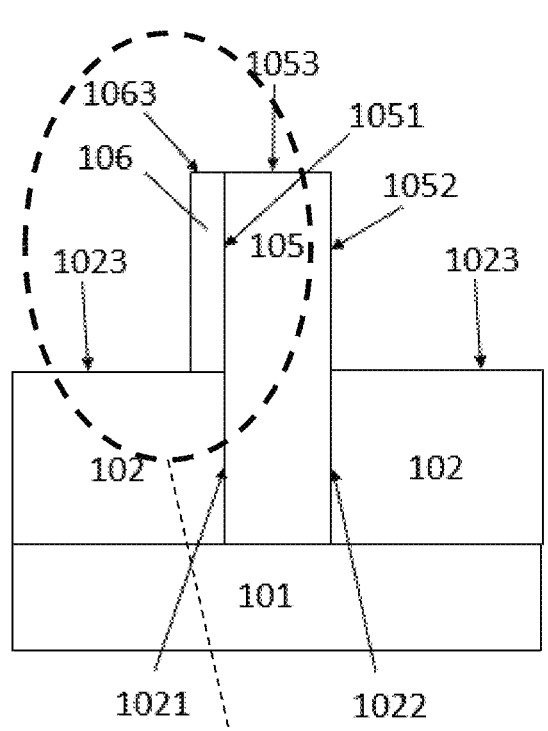 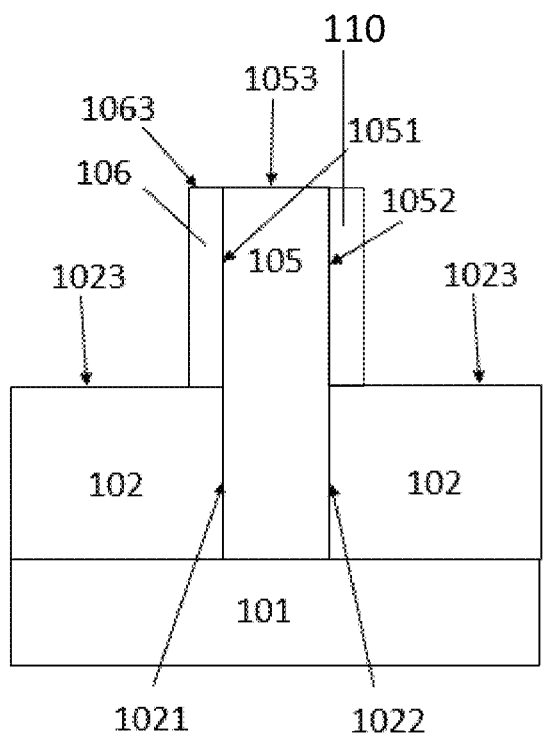
FIG. 12A  FIG. 12B
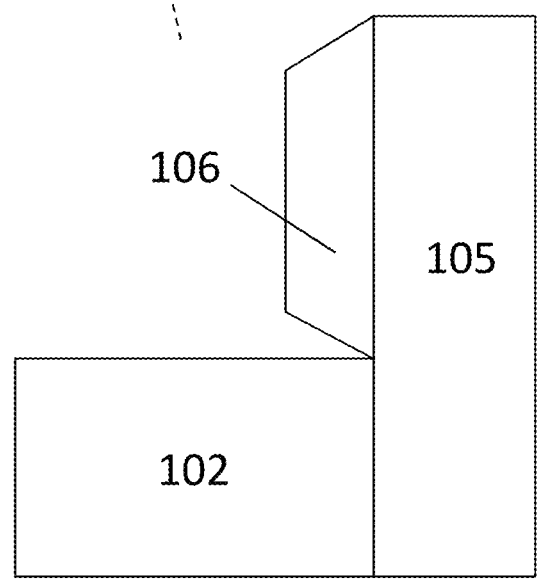
FIG. 13

HIGH ASPECT RATIO CHANNEL SEMICONDUCTOR DEVICE AND METHOD OF MANUFACTURING SAME

CROSS-REFERENCE TO RELATED APPLICATIONS

This application is a divisional of U.S. patent application Ser. No. 15/713,417, filed Sep. 22, 2017, which claims foreign priority to European Patent Application No. EP 16190164.0, filed Sep. 22, 2016. The content of each is incorporated by reference herein in its entirety.

BACKGROUND

Field

The disclosed technology generally relates to semiconductor devices, and more particularly to a semiconductor device having a high aspect ratio channel layer, and to a method of manufacturing the semiconductor device. The disclosed technology also relates to a complementary semiconductor device having high aspect ratio channel and having tight pitch, and to a method for manufacturing the complementary semiconductor device.

Description of the Related Technology

High mobility materials such as III-V material are drawing much attention for CMOS at advanced technology nodes (10 nm and beyond). In order to meet the specifications of these advanced nodes in terms of short channel control (such as subthreshold slope and drain-induced barrier lowering), a tri-gate quantum well structure or a gate all around structure/ nanowire (GAA/NW) structure may be employed to maintain electrostatic control.

However, integrating these structures at the very large scale integration (VLSI) level on 300 mm or larger wafers is a considerable technical challenge. To be competitive, III-V materials should be monolithically integrated with Si, in order to benefit from the existing Si-based semiconductor processing. The use of Si as a substrate would also enable the integration of several functional blocks on the same platform, such as for example logic, high-frequency, and I/O circuitry. The main challenge for a monolithic integration scheme is solving the large mismatch between the Si substrate and high-mobility material systems, which lead inevitably to the formation of misfit dislocation defects. A channel with high crystal quality and low defect density may ensure sufficient device performance. Also the high package density of complementary semiconductor devices in the current technology node demands for a high degree of scaling.

There is, moreover, a need for co-integration of different high-mobility materials for both p-FET and n-FET such as, for example, Ge as p-FET channel and II/V as n-FET channel.

A possible solution is the use of semiconductor-on-insulator substrate. However, the cost of semiconductor-on-insulator substrates is substantially higher than standard starting material such as Si.

Thus, there is a need for high-mobility semiconductor devices and more specifically for co-integration of different high-mobility transistors to address these and other disadvantages.

There is a further need for scaled semiconductor device, more specifically devices having high aspect ratio channel and methods for making such devices.

Furthermore with the continuous scaling towards sub 10 nm-technology nodes, lithography and patterning is driven to its limit as the pitch between subsequent fins becomes small. There is thus a need for tight pitch semiconductor device having the pitch between neighbouring transistors that can be scaled easily below the limits using current patterning techniques.

SUMMARY OF CERTAIN INVENTIVE ASPECTS

It is an aim of the disclosed technology to provide a semiconductor device having a high aspect ratio channel and a method for manufacturing such a semiconductor device. With high aspect ratio is meant that the channel is taller than it is wide (having a height which is more than the width of the channel structure). The semiconductor device according to the disclosed technology may be used for standard FinFet devices or vertical devices (with vertical devices is meant that the whole device is in the vertical direction i.e. the source/drain regions are on the top/bottom of the gate rather than being located left/right of the gate as in a FinFet structure).

Moreover it is an aim of the disclosed technology to provide a semiconductor device having thigh pitch transistors meaning the pitch between subsequent transistors is below the pitches that can currently be achieved with prior art patterning and lithography techniques.

A first inventive aspect relates to a method for manufacturing a semiconductor device, the method comprising providing a dielectric isolation layer with an opening on a semiconductor substrate; the opening being confined by a first and a second sidewall surface; the dielectric isolation layer having a top surface; providing in the opening on the semiconductor substrate a fin structure protruding above the top surface from the dielectric isolation layer; the fin structure comprising a first and a second opposite exposed sidewall surface being aligned with the first and a second sidewall surface respectively and an exposed top surface; providing on the dielectric isolation layer a first vertical channel layer along and in contact with the first exposed sidewall surface of the fin structure; the first vertical channel layer comprising a first channel material being different from the fin material of the fin structure; the first vertical channel layer having a top surface; providing a dielectric layer on the dielectric isolation layer adjacent and in contact with the first vertical channel layer, the dielectric layer having a top surface which is lower than the top surface of the first vertical channel layer; removing at least a top portion of the fin structure thereby creating a trench, the trench having a bottom surface being lower than the top surface of the dielectric isolation layer; providing in the trench a dielectric filling material; such that the top surface of the dielectric layer is substantially planarized with the top surface of the dielectric filling material and thereby making the first vertical channel layer freestanding.

According to embodiments of the first inventive aspect the fin structure is completely removed. Thus the final semiconductor device does not comprise the fin structure anymore. The opening then only comprises the dielectric filling material.

According to embodiments of the first inventive aspect, the method further comprises providing a second vertical channel layer along and in contact with the second exposed sidewall surface of the fin structure; the second vertical channel layer comprising a second channel material being different from the fin material; the second channel layer having a top surface; providing the dielectric layer also on the exposed dielectric isolation layer adjacent and in contact with the second vertical channel layer, the dielectric layer having a top surface which is lower than the top surface of the second vertical channel layer and being also substantially planarized with the top surface of the dielectric filling material. The second vertical channel layer may be provided together with the first vertical channel layer or may be provided in different process steps.

According to embodiments of the first inventive aspect, the first vertical channel material and/or the second vertical channel material are lattice mismatched with the fin material wherein the lattice mismatch is larger or equal to 0% and smaller or equal than 5%.

According to embodiments of the first inventive aspect, the width of the first vertical channel (W6) and/or the second vertical channel (W10) is smaller than the width W of the fin structure.

According to embodiments of the first inventive aspect, width W6 is different from width W10. It is an advantage that tight pitch transistors may be formed having different aspect ratio. This may be beneficial depending on the application of the device/transistors.

According to embodiments of the first inventive aspect, the dielectric isolation layer, the dielectric layer and the dielectric filling material comprise the same dielectric material. It is an advantage that processing is easy since same material may be deposited/provided one on or aside another. This will benefit the electric isolation capacities of the dielectric layers.

According to embodiments of the first inventive aspect, the pitch P1 between the first vertical channel (106) and/or the second vertical channel is smaller than 50 nm. It is thus an advantage that tight pitch devices/transistors may be formed. Whereas the pitch between subsequent devices is normally defined by the technology node, the pitch P1 is according to the disclosure defined by the width of the fin structure (and thus not by the distance or pitch between subsequent fin structures).

According to embodiments of the first inventive aspect, the method for providing a semiconductor device is a method for providing complimentary semiconductor device; the first vertical channel layer and the second vertical channel layer having opposite doping type. The first vertical channel layer may thus act as an NMOS or PMOS transistor, whereas the second vertical channel layer then acts a PMOS or NMOS transistor respectively (and vice versa).

According to embodiments of the first inventive aspect, the method further comprises providing a gate stack around, a source region at one side of and a drain region at the opposite side of each of the first vertical channel layer and/or second vertical channel layer (if present), the gate stack for controlling a flow of carriers, the source region for injecting carriers in the respective channel layers and the drain region for receiving carriers from the respective channel layers. Depending on the device, the source/drain regions may be provided at opposite sides along the height of the vertical channel layer (thus a real vertical channel device) or may be provided at opposite sides along the length of the vertical channel layer (thus a finFET-like device).

A second inventive aspect relates to a semiconductor device comprising a semiconductor substrate; a dielectric isolation layer on the semiconductor substrate, the dielectric isolation layer having an opening being confined by a first and a second sidewall surface; the dielectric isolation layer having a top surface; in the opening a filling isolation structure protruding from the semiconductor substrate above the top surface, the filling isolation structure comprising at least a dielectric filling layer; a dielectric layer on the dielectric isolation layer; both the dielectric layer and the dielectric filling layer having a top surface in common; a first vertical channel layer sandwiched in between and in contact with the dielectric layer and the dielectric filling layer, the first vertical channel layer having a sidewall surface being aligned with the first sidewall surface and the first vertical channel layer extending above the common top surface.

According to embodiments of the second inventive aspect the filling isolation structure further comprises a fin structure in between the semiconductor substrate and the dielectric filling layer, wherein the fin structure has a top surface which is lower than the top surface of the dielectric isolation layer.

According to embodiments of the second inventive aspect the semiconductor device further comprises a second vertical channel layer along and in contact with the second sidewall surface and sandwiched in between and in contact with the dielectric layer and the dielectric filling layer, the second vertical channel layer having a sidewall surface being aligned with the second sidewall surface and extending above the common top surface.

According to embodiments of the second inventive aspect the first vertical channel material and the second vertical channel material are lattice mismatched, the lattice mismatch being larger or equal to 0% and smaller or equal than 10%.

According to embodiments of the second inventive aspect the opening has a width W and the first vertical channel and/or the second vertical channel have a width (W6, W10) being smaller than W.

According to embodiments of the second inventive aspect each the first and/or second vertical channel layer further comprises a source region for injecting carriers in the first and/or second vertical channel layer, the drain region for receiving the carriers from the first and/or second vertical channel layer and a gate stack for controlling the flow of the carriers.

It is an advantage of the dielectric isolation layer that the layer serves as an isolation layer between the channel layer and the substrate without the need for expensive semiconductor-on-insulator substrates such as for example a semiconductor-on-insulator (SOI) substrate According to embodiments both the dielectric layer and the dielectric filling layer may comprise the same dielectric material. It is an advantage of having the same material for both the dielectric layer and the dielectric filling layer that the etching conditions will be the same for both.

According to embodiments the first and/or vertical channel may comprise either Si or any high-mobility material. It is an advantage that a semiconductor device having high mobility may be obtained.

According to embodiments, the first and second vertical channel layer may comprise the same channel material or may comprise a different channel material. In the latter case it is an advantage that a complementary semiconductor device (CMOS) may be easily achieved.

It is an advantage of the first and/or second high aspect ratio vertical channel layer that even very small structures may be provided, i.e. smaller than the width of the fin structure which in prior art will serve as the channel layer. It is an advantage of the disclosed technology that a semiconductor device may be obtained having a small critical dimension (CD) suitable for sub 10 nm technology node.

It is an advantage of having a low lattice mismatch between the fin material and the first and/or second vertical channel material 106, which may be grown epitaxially on the fin material, that pseudomorphic growth of the channel material is allowed. This means that when growing a material on top of another material with a different lattice constant (such as for example by hetero-epitaxy), the material will try to take over the lattice constant of the another material by becoming deformed, so becoming compressive or tensile strained without the formation of any strain releasing misfit dislocations. It is thus an advantage of the semiconductor device according to embodiments of the disclosed technology that the active region, i.e. the channel layer is substantially defect-free.

It is an advantage that a semiconductor device may be obtained comprising transistors or active regions suitable for different purposes depending on the critical dimension (CD) or width of the active region (or channel). Both highly scaled channel regions (i.e. for example having a width smaller than 5 nm) and more relaxed channel regions (for example having a width larger than 5 nm) may be achieved.

It is an advantage of embodiments of the semiconductor device according to the disclosed technology that a tight pitch may be achieved, being pitch P1 in between the first vertical channel and the second vertical channel. Pitch P1 is much smaller than pitch P in between subsequent fin structures. In prior art device, the channel layers or active regions are provided in the fin structures located a pitch P from each other.

It is an advantage of embodiments of the semiconductor device according to the disclosed technology that a pitch P1 smaller than 50 nm may be achieved, even smaller than 30 nm or even smaller than 20 nm.

It is an advantage of the disclosed technology that vertical channel layers with different CD (fin width) may be obtained.

BRIEF DESCRIPTION OF THE DRAWINGS

The disclosure will be further elucidated by means of the following description and the appended figures.

FIGS. 6 to 17 schematically illustrate different steps for manufacturing a semiconductor device comprising a first and/or a second vertical channel layer according to embodiments of the disclosed technology.

Figure 1A:
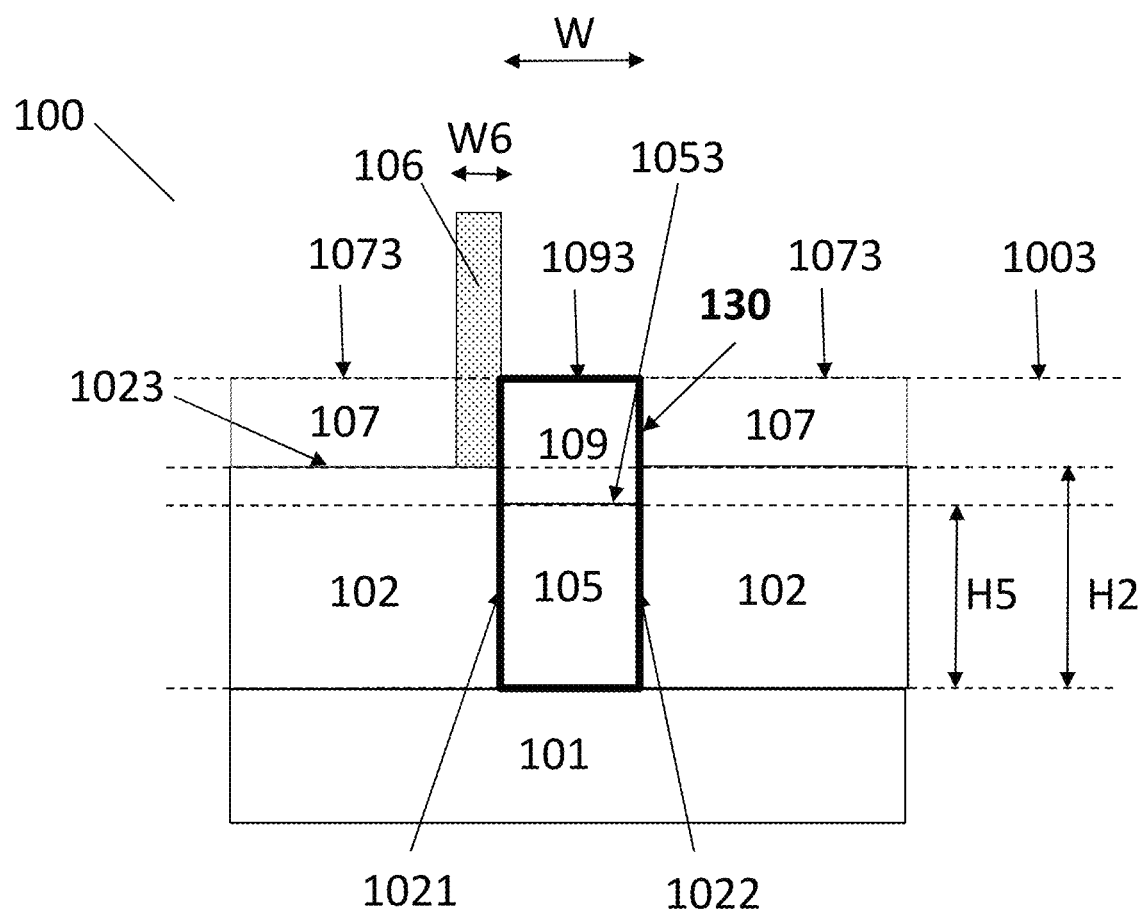
FIG. 1A to 1C schematically illustrates side view and top view of a semiconductor device comprising a first vertical channel layer according to embodiments of the disclosed technology.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosure will be further elucidated by means of the following detailed description of several embodiments of the disclosure and the appended figures.

In the following detailed description, numerous specific details are set forth in order to provide a thorough understanding of the disclosure and how it may be practiced in particular embodiments. However, it will be understood that the disclosed technology may be practiced without these specific details. In other instances, well-known methods, procedures and techniques have not been described in detail, so as not to obscure the disclosed technology. While the disclosed technology will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

As described herein, a high mobility material refers to a material having a higher electron or hole mobility compared to Si. A high mobility material may comprise germanium (Ge), SiGe, a III-V material (e.g., gallium arsenide (GaAs), indium gallium arsenide (InGaAs), aluminium arsenide (AlAs), indium aluminium arsenide (InAlAs), indium arsenide (InAs), indium phosphide (InP), gallium phosphide (GaP), aluminium phosphide (AlP), indium gallium phosphide (InGaP), indium antimonide (InSb), gallium antimonide (GaSb), aluminium antimonide (AlSb), indium gallium antimonide (InGaSb), gallium nitride (GaN), indium gallium nitride (InGaN), aluminium nitride (AlN),), a II-VI material (e.g., cadmium telluride (CdTe), zinc telluride (ZnTe), zinc selenide (ZnSe), etc.), graphine, or a combination thereof.

As described herein, "horizontal" refers to a general direction along or parallel to a primary surface of a substrate, and "vertical" is a direction generally orthogonal thereto. The terms "horizontal" and "vertical" are used as generally perpendicular directions relative to each other independent of the orientation of the substrate in the three-dimensional space. However, it will be appreciated that in the context of semiconductor manufacturing, these and other directional terms will be understood to be within reasonable manufacturing variability.

In the following, certain embodiments will be described with reference to a silicon (Si) substrate, but it should be understood that they apply equally well to other semiconductor substrates. In embodiments, the "substrate" may include a semiconductor substrate such as e.g. a silicon, a germanium (Ge), or a silicon germanium (SiGe) substrate or even a gallium arsenide (GaAs), a gallium phosphide (GaP), a indium arsenide (InAs), a gallium antimonide (GaSb) and indium phosphide (InP) substrate. The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

Figure 1B:
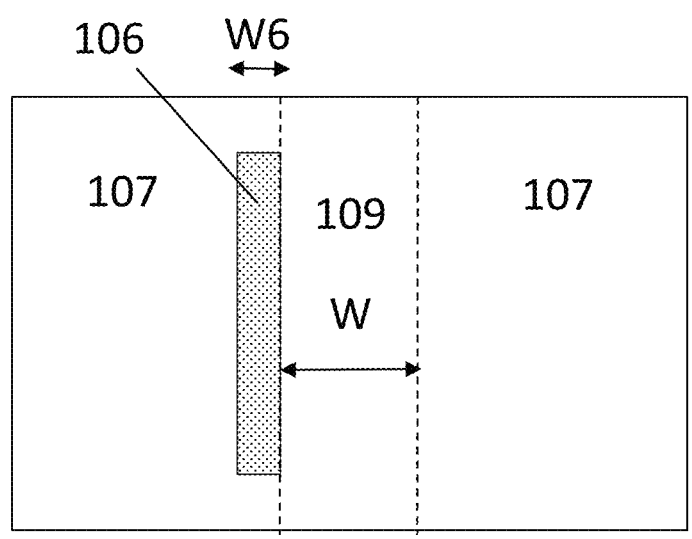

As described herein, the term lattice constant or lattice parameter refers to the intrinsic lattice constant of a material which is defined by the physical dimension of unit cells in a crystal lattice of that material at 300K. Typically, when growing different materials on another material or substrate, the grown material strains to conform to match the lattice constant of the host layer or the prior layer (i.e. another material or substrate) to minimize layer stress. However, this matching may lead to unmatched lattice parameters, such as strained layer, because the deposited material strains to accommodate the underlying lattice constant, or such as a relaxed layer due to dislocation defects. FIGS. 1A and 1B show a side view and a top view respectively of a semiconductor device according to an inventive aspect of the disclosure and will now be described in more detail. The semiconductor device 100 comprises a semiconductor substrate 101.

On the semiconductor substrate 101 a fin structure or elongated structure 105 may be present which is confined in between a first 1021 and a second 1022 sidewall surface of a dielectric isolation layer 102, e.g., shallow trench isolation layer. The fin structure 105 is defined by a height H5 which is lower than a height H2 of the dielectric isolation layer 102. Otherwise said, the top surface 1053 of the fin structure 105 is lower than the top surface 1023 of the dielectric isolation layer 102. The difference in height between the fin structure 105 and the dielectric isolation layer 102, delta H=H2−H5, is greater than zero, e.g., 5 nm or more, according to embodiments. It will be appreciated that the value of delta H is critical for preventing an electrical short path between the channel layer 106 and the substrate 101. Preferably, the delta H is such that a leakage conductive path is reduced or eliminated from the channel layer 106 to the substrate 101 via the fin structure 105. That is, the channel layer 106 does not electrically connect to the fin structure 105 directly or through another conducting or semiconducting material. The height H2 and delta H may be fine-tuned by engineering depending on the different parameters used such as for example the fin material, the substrate material, the width W of the fin structure, the lattice mismatch between the fin material 105 and the channel material 106, such that no leakage current can flow between the channel region 106 and the substrate 101 of the final semiconductor device (i.e. the semiconductor device according the disclosed technology).

According to alternative embodiments, while the fin structure or elongated structure 105 is present in an intermediate device, the fin structure is removed completely during the manufacturing process of the semiconductor device according to the disclosed technology such that no fin structure 105 is present in the final semiconductor device. Such a semiconductor device according to a embodiments of a first aspect is shown schematically in FIG. 1C. The scheme is similar to FIG. 1A except that the fin structure 105 is not present but replaced completely by the dielectric filling layer 109. In some embodiments, a filling isolation structure 130 comprises or consists of the dielectric filling layer 109 without the fin structure or which may consist of the partially remaining fin structure 105 and the dielectric filling layer 109.

It is an advantage of the dielectric isolation layer 102 that the layer serves as an isolation layer between the channel layer 106 and the substrate 101 without the need for expensive semiconductor-on-insulator substrates such as for example a semiconductor-on-insulator (SOI) substrate. Thus, according to embodiments, the substrate 101 is not an SIO substrate.

The fin structure is preferably an aspect ratio trapping (ART) fin structure, which means the fin structure is formed using ART. ART is a way to realize a low defect density in the grown crystal and often used (but not limited thereto) for non-silicon channels on a silicon substrate, otherwise said for integrating lattice mismatched materials. In this technique, high aspect ratio trenches or holes may be created in shallow trench isolation (STI) structures (dielectric layers) on silicon substrate. The dielectric isolation layer 102 may be referred to an STI structure. Fins made of for example III-V compound semiconductors, Ge or SiGe are then formed in these trenches by selective epitaxial growth (SEG). The crystalline defects originating from the lattice mismatch are guided to the non-crystalline dielectric STI sidewalls and there trapped, which enable obtaining active regions with a small amount of defects. The height of the STI sidewalls should be high relative to the size of the growth area so as to trap most, if not all, of the defects. An aspect ratio greater than 1 is required in order to trap the crystalline defects. Moreover ART may be used with large wafers (such as 300 mm wafers) compared to other techniques such as wafer-to-wafer bonding which is not preferred to be used with large wafers as it is difficult to produce a low defect density donor wafer. The use of SRB substrates is a solution in this case, however, the SRB substrates can be very expensive.

Although ART is preferred also other techniques may be used for the formation of the fin structures 105 in the dielectric isolation layer 102 such as, for example, by first forming an epitaxial layer of fin material on the substrate 101 and thereafter patterning the epitaxial layer, thereby forming the fin structure 105. STI regions may then be formed by providing the dielectric isolation layer 102 aside of the fin structure 105 on the semiconductor substrate 101.

The dielectric isolation layer 102 may comprise for example $SiO_2$, SiN, $Al_2O_3$, or any other suitable dielectric material which may serve as an electrical isolation material between the channel 106 and the substrate 101.

The fin structure 105 is a recessed fin structure in a final device. In an intermediate device, however, the fin structure 105 protrudes above the dielectric isolation layer 102, as described in further detail below with respect to disclosed methods for manufacturing a semiconductor device according to a second inventive aspect. By recessing this protruding fin structure according to embodiments, the fin structure 105 from the (final) semiconductor device according to a first inventive aspect may be formed. According to embodiments, the protruding fin structure may be recessed or removed partially (FIG. 1A) or even completely (FIG. 1C) such that no fin structure is present any more in the final device.

The semiconductor device 100 further comprises a dielectric layer 107 and a dielectric filling layer 109.

The dielectric layer 107 is present on the dielectric isolation layer 102 in contact with the top surface 1023 of the dielectric isolation layer 102.

Figure 1C:
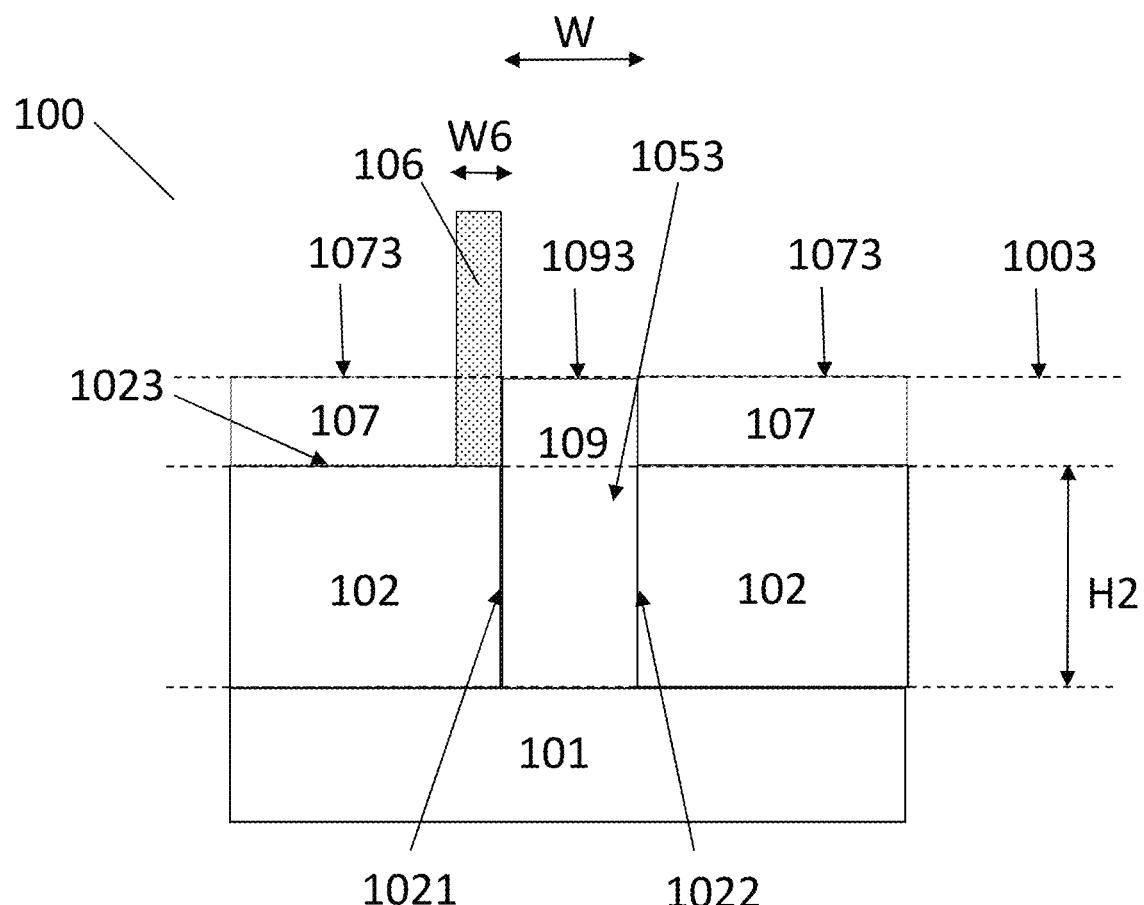

The dielectric filling layer 109 is present on the fin structure 105 and in contact with the top surface 1053 of the fin structure 105 in case the fin structure 105 is only partially recessed (as in FIG. 1A) or in contact with the top surface of the semiconductor substrate 101 if the fin structure 105 is completely removed (as in FIG. 1C).

The dielectric layer 107 and/or the dielectric filling layer 109 may comprise for example $SiO_2$, SiN, $Al_2O_3$, or any other dielectric material as known for a person skilled in the art which may serve as an electrical isolation material to the substrate 101 and in between the active regions 106.

The top surface 1073 of the dielectric layer 107 and the top surface 1093 of the dielectric filling layer 109 are substantially equal or planar thereby forming a common top surface 1003. The dielectric layer 107 and the dielectric filling layer 109 serve as an isolation layer to the substrate aside of the active region 106 of the semiconductor device 100.

According to embodiments, the dielectric layer 107 and the dielectric filling layer 109 may comprise the same material. It is an advantage of having the same material for both the dielectric layer 107 and the dielectric filling layer 109 that the etching conditions will be the same for both. For example, for planarizing both the dielectric layer 107 and the dielectric filling layer 109, one etch step can be used.

According to embodiments even the dielectric isolation layer 102, the dielectric layer 107 and the dielectric filling layer 109 may comprise the same material.

The semiconductor device further comprises a vertical channel layer 106 protruding from the top surface 1023 of the dielectric isolation layer 102. The vertical channel region 106 may also be referred to the active region of the semiconductor device. The vertical channel layer 106 is present and more specifically interposed or sandwiched between the dielectric layer 107 and the dielectric filling layer 109. The vertical channel layer 106 is thus along and in contact with a sidewall of the dielectric filling layer 109 at one side and along and in contact with a sidewall of the dielectric layer 107 at the other/opposite side. The sidewall of the dielectric filling layer 109 in contact with the vertical channel layer 106 and the first sidewall 1021 of the fin structure 105 are substantially aligned. This is because of the process steps used for forming the fin structure 105 and the dielectric filling layer 109 which are both formed in an opening of the dielectric isolation layer 102, more preferably in the high aspect ratio trenches or holes which are created in the shallow trench isolation (STI) structures (dielectric layers 102) on silicon substrate 1021 (as will be described in more detail further). The vertical channel layer 106 is extending above the common surface 1003 (i.e. above the top surfaces 1073, 1093). The vertical channel layer 106 has a width W6 which may be smaller than the width W of the fin structure 105. The vertical channel layer 106 may be a high aspect ratio structure, having an aspect ratio preferably higher than 1, more preferably higher than 10. The vertical channel layer 106 has a thickness smaller than 20 nm, more preferably smaller than 10 nm. The vertical channel layer has a height preferably larger than 20 nm, more preferably larger than 50 nm, even more preferably larger than 100 nm.

The vertical channel layer forms the active region of the semiconductor device and serves for transporting carriers from a source region to a drain region.

The vertical channel layer 106 may comprise either Si or any high-mobility material. It is an advantage that a semiconductor device having high mobility may be obtained.

It is an advantage of this high aspect ratio vertical channel layer that even very small structures may be provided, i.e. smaller than the width of the fin structure 105 which in prior art will serve as the channel layer. It is an advantage of the disclosed technology that a semiconductor device may be obtained having a small critical dimension (CD) suitable for sub 10 nm technology node.

Figure 2:
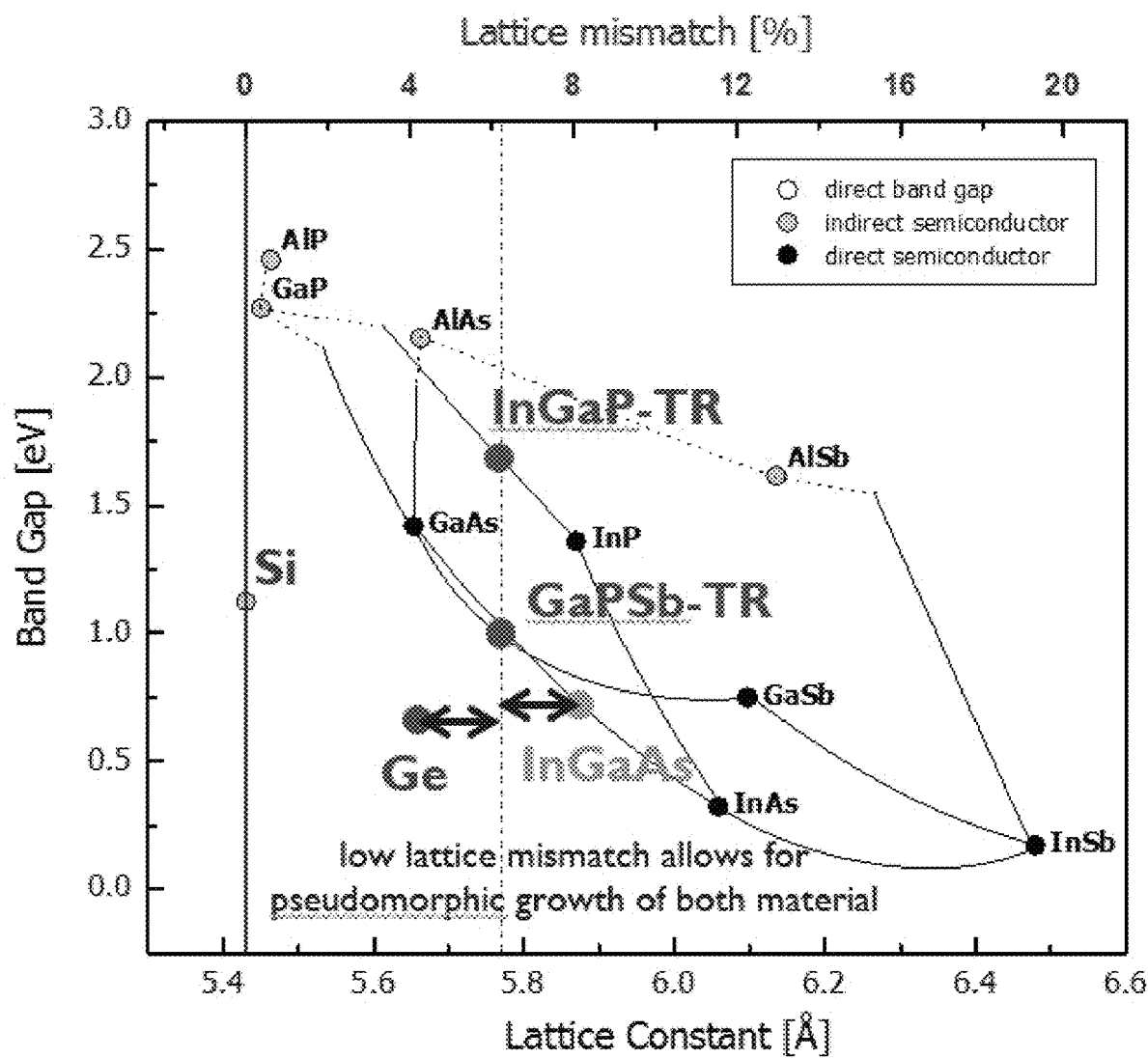
FIG. 2 shows a graph of band gap in function of the lattice constant for different material which may be used for the semiconductor device according to embodiments of the disclosed technology.

The vertical channel layer 106 comprises a channel material which may be lattice mismatched with the fin material of the fin structure 105. The lattice mismatch (which is the difference in lattice constant) between the fin material and the channel material is preferably 5% or lower, more preferably lower than 3% even more preferably lower than 1%. If the lattice mismatch becomes higher than 5%, defects such as dislocations may form in the vertical channel layer, which may deteriorate device performance, e.g., increase off state leakage current. In FIG. 2, a graph is shown with the lattice constant for different possible materials at 300K. Depending on the bandgap of the material, the material is a direct or indirect semiconductor. The lattice constant for Si is shown as a reference, being about 5.431 Angstroms. Top axis of graph in FIG. 2 shows the percentage of lattice mismatch. For example for a fin material 105 comprising InGaP (having a lattice constant of about 5.77 Angstroms), a vertical channel material 106 comprising Ge or InGaAs may be formed on the sidewall of the fin structure 105 as the lattice mismatch is less than 5%, even less than 2% from InGaP.

According to embodiments, the lattice mismatch between the fin material of the fin structure 105 and the channel material 106 may be 0%. For example InP may be used as fin material in combination with 53% InGaAs, which has similar lattice constant as InP, as the channel material. Another example may be: GaAs as fin material in combination with Ge for the channel material.

It is an advantage of having a low lattice mismatch between the fin material 105 and the vertical channel material 106 that pseudomorphic growth of the channel material is allowed. This means that when growing a material on top of another material with a different lattice constant (such as for example by hetero-epitaxy), the material will try to take over the lattice constant of the another material by becoming deformed, so becoming compressive or tensile strained without the formation of any strain releasing misfit dislocations. As a consequence a low amount or no misfit-defects are formed in the vertical channel layer (which is formed aside of the fin structure as will be explained in the more detailed description of the method for manufacturing a semiconductor device according to a second inventive aspect). It is thus an advantage of the semiconductor device according to embodiments of the disclosed technology that the active region, i.e. the channel layer is substantially defect-free. With defect-free is meant that ideally no defects are present. In reality however this is not possible and what is needed could be a defect density of less than $10^3/cm^3$. In practice this is very hard to achieve.

The semiconductor device according to a first inventive aspect may further comprise a source and drain region and a gate region. The vertical channel layer may be further more doped such that it comprises a source and drain region in between the channel region, wherein the source region serves for injecting carriers into the channel region towards the drain region. The source and/or drain region may also be fabricated as separate regions from the vertical channel region 106. A gate region or gate stack, which typically comprises a gate electrode layer and a gate dielectric layer sandwiched in between the gate electrode layer and the channel region, may be formed around the vertical channel layer. This may be done as a gate-all-around gate region thereby forming a gate-all-around semiconductor device, or the gate region may also be wrapped around the vertical channel layer as for fin-like structures thereby forming a double-gate or tri-gate semiconductor device.

Figure 3A:
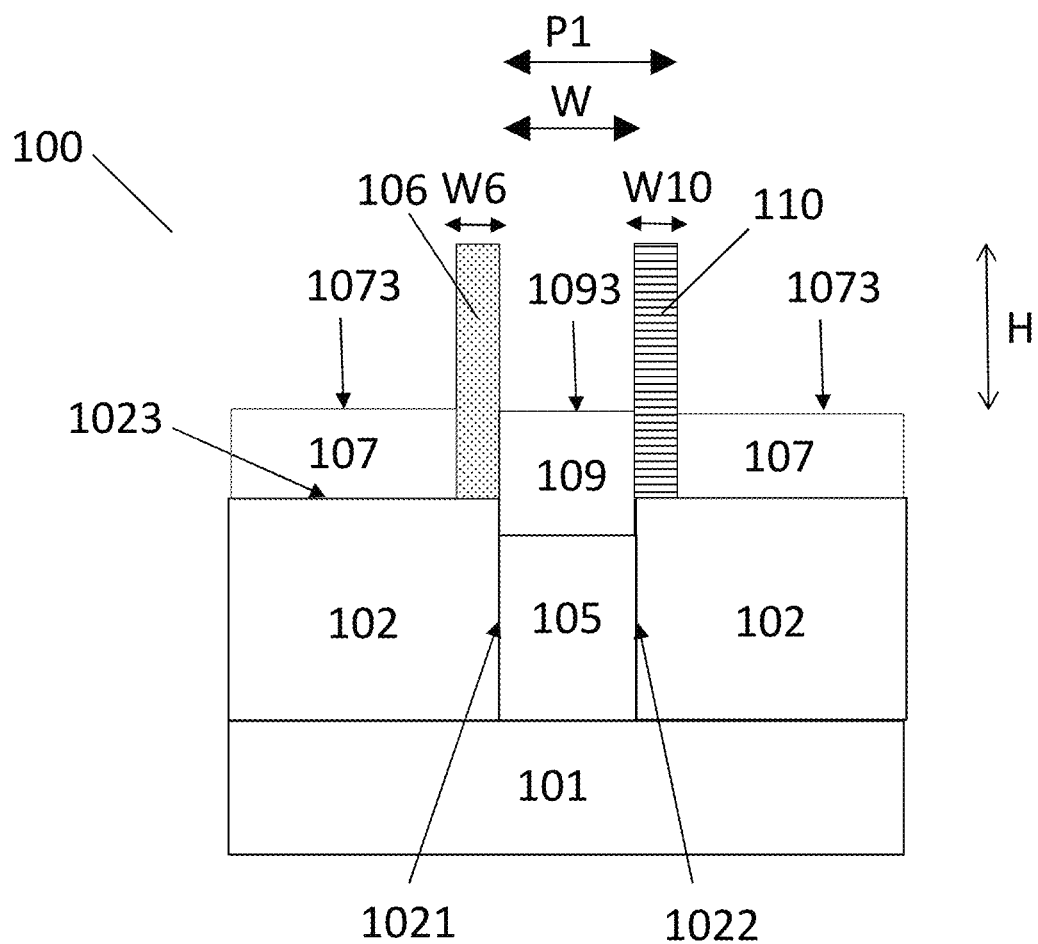
FIG. 3A to 3B schematically illustrates side view and top view of a semiconductor device comprising a first and a second vertical channel layer according to embodiments of the disclosed technology.
Figure 3B:
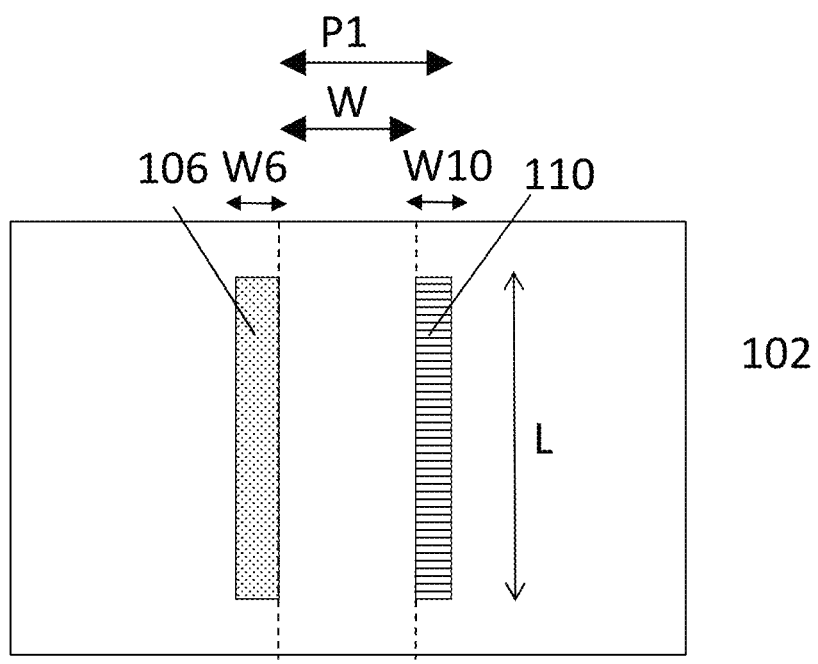
Figure 4A:
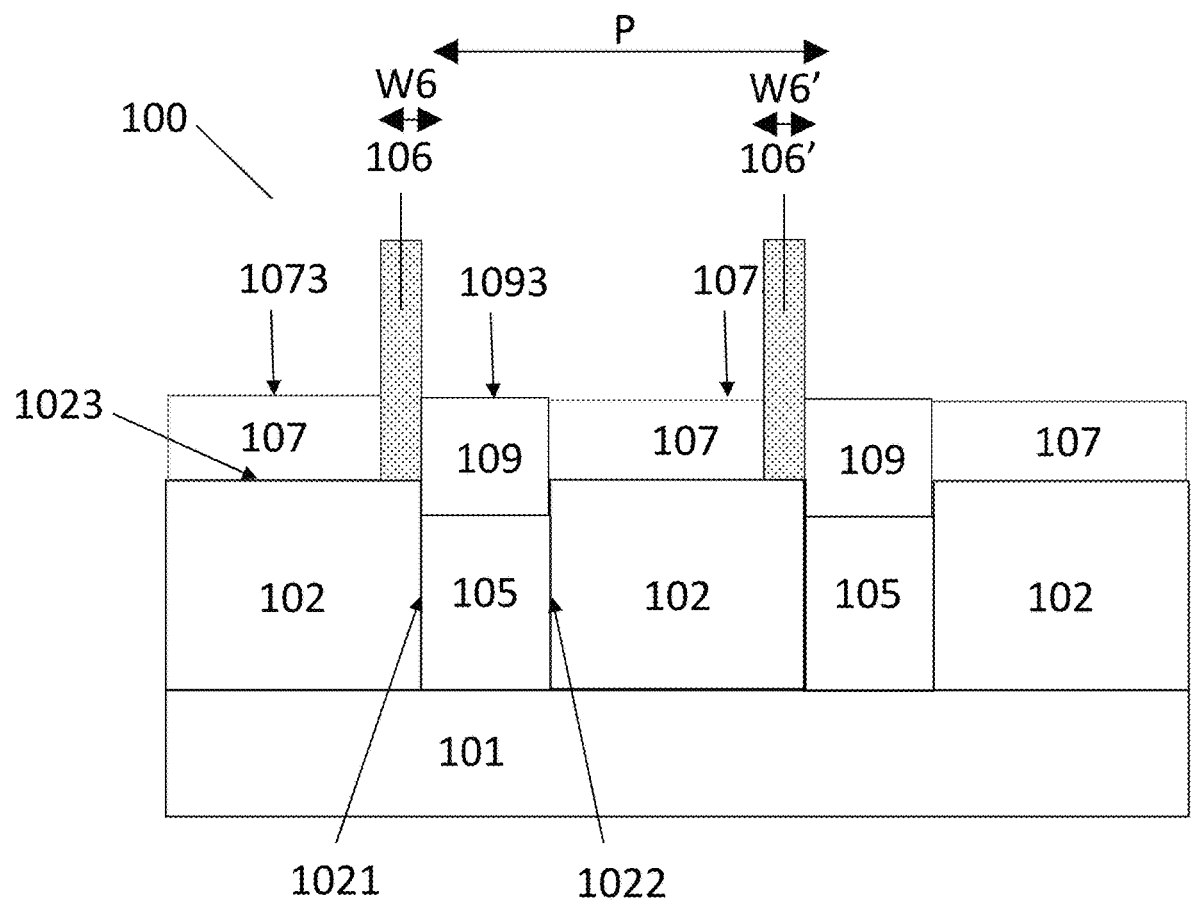
FIG. 4A to 4B schematically illustrates side view and top view of neighboring semiconductor devices comprising a first vertical channel layer according to embodiments of the disclosed technology.
Figure 4B:
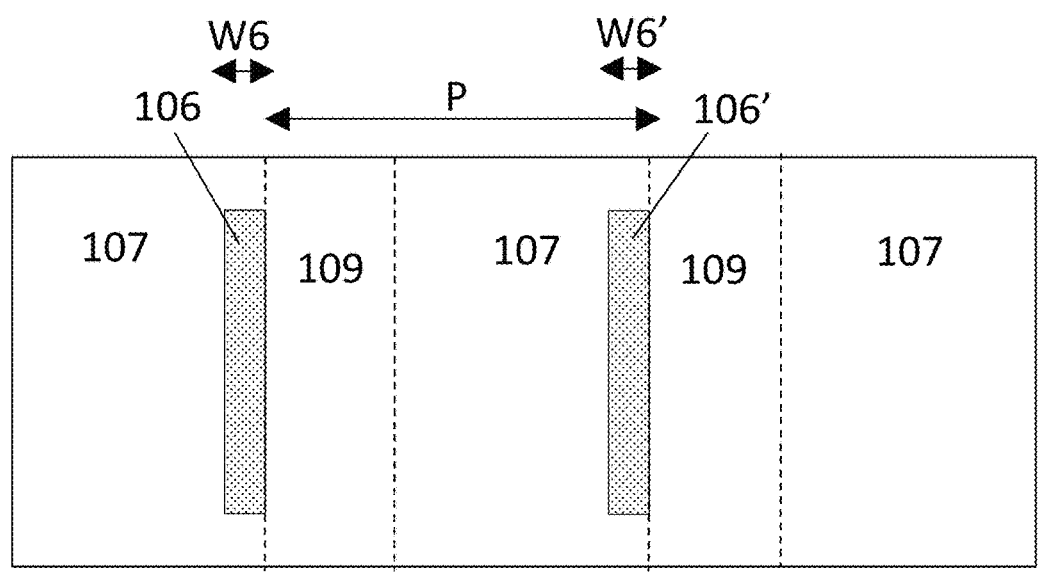

According to embodiments the semiconductor device may further comprise another (second) vertical channel layer 110, but in this case located at the opposite side of the fin structure 105 in between the dielectric layer 107 and the dielectric filling layer 109. A schematic side view and top view is shown in FIGS. 3A and 3B respectively. The semiconductor device thus further comprises, similar to the (first) vertical channel layer 106 already described in detail above, another (second) vertical channel layer 110 protruding from the top surface 1023 of the dielectric isolation layer 102. The second vertical channel layer 110 is present and more specifically sandwiched in between the dielectric layer 107 and the dielectric filling layer 109. The second vertical channel layer 110 is thus along and in contact with a sidewall of the dielectric filling layer 109 at one side and along and in contact with a sidewall of the dielectric layer 107 at the other/opposite side. The sidewall of the dielectric filling layer 109 in contact with the vertical channel layer 110 and the second sidewall 1022 of the fin structure 105 are substantially aligned. This is because of the process steps used for forming the fin structure 105 and the dielectric filling layer 109 which are both formed in an opening of the dielectric isolation layer 102, more preferably in the high aspect ratio trenches or holes which are created in the shallow trench isolation (STI) structures (dielectric layers 102) on silicon substrate 101. The second vertical channel layer 110 is extending above the common surface 1003 (i.e. above the top surfaces 1073, 1093). The second vertical channel layer 110 has a width W10 which is smaller than the width W of the fin structure. The second vertical channel layer 110 is thus a high aspect ratio structure, having an aspect ratio preferably higher than 1, more preferably higher than 10. The second vertical channel layer 110 has a thickness smaller than 20 nm, more preferably smaller than 10 nm. The second vertical channel layer 110 has a height preferably larger than 20 nm, more preferably larger than 50 nm, even more preferably larger than 100 nm. The width W6 and W10 may be the same or different. It is an advantage that a semiconductor device may be obtained comprising transistors or active regions suitable for different purposes depending on the critical dimension (CD) or width of the active region (or channel). Both highly scaled channel regions (i.e. for example having a width smaller than 5 nm) and more relaxed channel regions (for example having a width larger than 5 nm) may be achieved. In FIG. 3A the height H is shown for each of the vertical channel layers whereas in FIG. 3B the length L is shown for each of the vertical layers.

The vertical channel layer 106 and the second vertical channel layer 110 may comprise the same channel material or may comprise a different channel material. In the latter case it is an advantage that a complementary semiconductor device (CMOS) may be achieved. As already described above the channel material for the another vertical channel layer 110 may be chosen in function of the lattice constant of the fin material.

The other vertical channel layer 110 comprises a channel material which may be lattice mismatched with the fin material of the fin structure 105. The lattice mismatch (which is the difference in lattice constant) between the fin material and the channel material is preferably 5% or lower, more preferably lower than 3% even more preferably lower than 1%. If the lattice mismatch becomes higher than 5% this will induce defects in the vertical channel layer which may deteriorate the adequate working of the device. In FIG. 2, a graph is shown with the lattice constant for different possible materials. Depending on the bandgap of the material, the material is a direct or indirect semiconductor. The lattice constant for Si is shown as a reference, being 5.431 Angstroms. For example for a fin material comprising InGaP (having a lattice constant of about 5.77 Angstroms. Top axis of graph in FIG. 2 shows the percentage of lattice mismatch. For a fin material comprising InGaP, a vertical channel material comprising Ge or InGaAs is for example a possibility as the lattice mismatch is less than 5%, even less than 2% from InGaP. The lattice mismatch between the fin material of the fin structure 5 and the channel material may be 0%.

Possible combinations for the fin material and channel materials (both n and/or p-type) are shown in table below:

| Fin 105 | Channel 106 | Channel 110 |
| --- | --- | --- |
| GaAs | Ge (n) | Ge (p) |
| GaAs | InGaAs (n) | Ge (p) |
| InAlSb | InSb (n) | InGaSb (p) |
| GaP | Si (n) | Si (p) |
| SiGe | Si (n) | Si (n) |
| Si | SiGe (p) | SiGe (p) |

According to embodiments where the semiconductor device comprises both the first vertical channel layer 106 and the second vertical channel layer 110, the lattice constant mismatch should be chosen within a certain window around the lattice constant of the fin structure 105. For example as shown in FIG. 2 for a fin structure comprising InGaP a vertical channel layer 106 may be provided at one side of the fin structure comprising Ge and another vertical channel layer 110 may be provided at the other side of the fin structure comprising InGaAs. For both material (Ge and InGaAs) the lattice mismatch with the fin material 105 is not higher than 5%. Depending on the doping both a p-type and n-type vertical channel may be formed. Alternative both channel layers 106, 110 may both be p-type but comprising a different material.

FIGS. 4A, 5A and FIGS. 4B,5B show a schematic side view and top view respectively of a semiconductor device according to embodiments of the disclosed technology wherein the vertical channel 106 (for FIGS. 4A, 4B) and the another vertical channel layer 110 (for FIGS. 5A, 5B) are present multiple times. This is achieved by providing multiple fin structure 105 which are separated at a pitch P from each other.

It is an advantage of embodiments of the semiconductor device according to the disclosed technology that a tight pitch may be achieved, being pitch P1 in between the vertical channel 106 and the another vertical channel 110. Pitch P1 is much smaller than pitch P in between subsequent fin structures. In prior art device, the channel layers or active regions are provided in the fin structures located a pitch P from each other. According to the disclosed technology the fin structures 105 are sacrificial structures which enable to provide vertical channel layers 106, 110 at a smaller pitch P1 from each other. Based on a given pitch P of the fin structures, the amount of channel regions (as fabricated) according to the disclosed technology per footprint may be doubled. This amount will be determined by the pitch P of the fin structures, the CD (critical dimension) or width W of the fin structures and the growth thickness of the channel material on the sidewall of the fins. This will now be explained with some examples in accordance with FIG. 5B. For example for a fin structure 105 with 7 nm CD (or W) and a pitch P of 32 nm, one can achieve a vertical channel with CD or W6, W10 of 5 nm (i.e. the thickness grown at the sidewall of the 7 nm fin structures 105) and a final pitch P1 being 12 nm and pitch P2 being 20 nm. In another example the same principle is applied for a starting design rule of a fin structure having 7 nm CD (or W) and 28 nm pitch P. By growing a channel material with a thickness of 7 nm on the sidewall of the fin structures a pitch P1 of 14 nm and P2 of 14 nm may be achieved.

The thickness of the channel material grown at each side of the fin structure may differ and thus results in different CD for the final semiconductor devices. It is an advantage of the disclosed technology that fin structures with different CD (fin width) may be obtained. Using prior art method such as direct lithography or SADP processing it is very difficult to obtain fin structures with different widths. With the method according to the disclosed technology this may be easily achieved by providing/growing a different thickness of channel material at the sides of the fin structures.

According to an inventive aspect a method for manufacturing a semiconductor device is disclosed. Different steps of the method will now be explained in more detail together with FIGS. 6 to 17.

Figure 6:
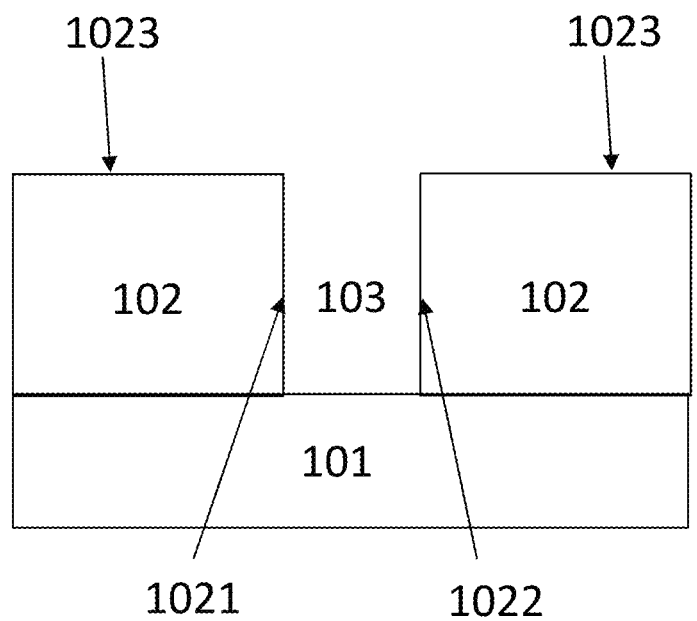
Figure 7:
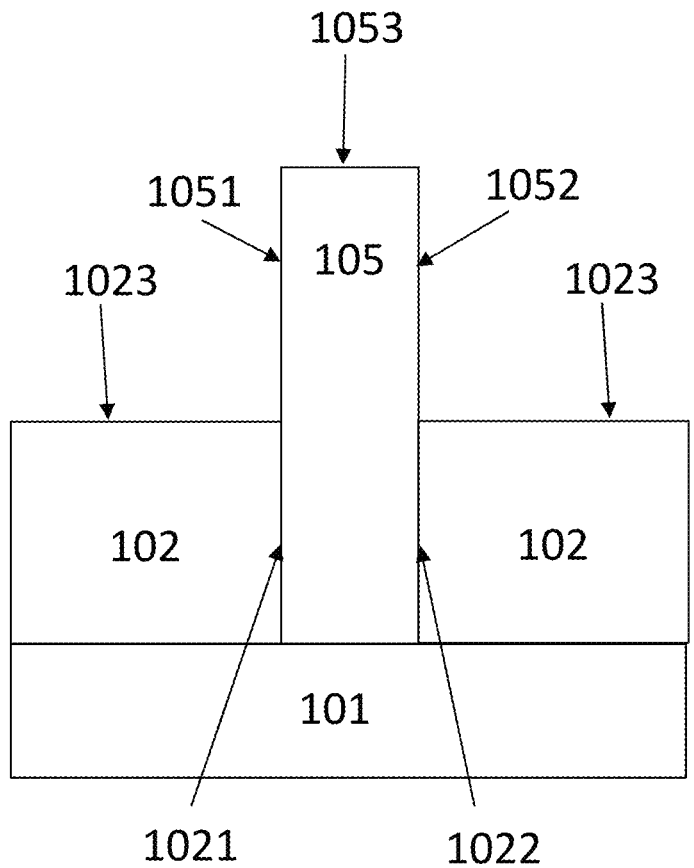

The method comprises providing a dielectric isolation layer 102 with an opening 103 on a semiconductor substrate 101; the opening 103 being confined by a first 1021 and a second 1022 sidewall surface; the dielectric isolation layer 102 having a top surface 1023 as shown in FIG. 6 and providing in the opening 103 on the semiconductor substrate 101 a fin structure 105 protruding above the top surface 1023 from the dielectric isolation layer 102; the fin structure 105 having a first 1051 and a second 1052 exposed sidewall surface and an exposed top surface 1053; the fin structure comprising a fin material as shown in FIG. 7. The bottom surface of opening 103 may be V-shaped as this is preferential for the growth of the fin material in the opening 103.

It is an advantage of the dielectric isolation layer that the layer serves as an electrical isolation layer between the channel layer 106 and the substrate 101 without the need for expensive semiconductor-on-insulator substrates such as for example a semiconductor-on-insulator (SOI) substrate.

As already described in more detail above, the fin structure is preferably an aspect ratio trapping (ART) fin structure. Although ART is preferred for the formation of the fin structure 105, also other techniques may be used for the formation of the fin structure 105 in the dielectric isolation layer 102 such as for example by forming an epitaxial layer of fin material on the substrate and thereafter patterning this epitaxial layer by for example lithography and etching thereby forming the fin structure 105. STI regions or device isolation regions 102 may then be formed by providing the dielectric isolation layer 102 aside of the patterned fin structure 105 on the semiconductor substrate 101.

The dielectric isolation layer 102 may comprise for example $SiO_2$, SiN, $Al_2O_3$, or any other dielectric material as known for a person skilled in the art which may serve as an electrical isolation material to the substrate 101. The dielectric isolation layer 102 may be formed immediately with the required thickness or may be recessed to the required thickness such that the top surface of the dielectric layer 1023 becomes lower than the top surface of the fin structure 1053. In prior art semiconductor devices, this intermediate structure may be compared to a so-called STI template, wherein the dielectric isolation portions 102 serve as STI regions to isolated the fin structure 105.

Figure 8:
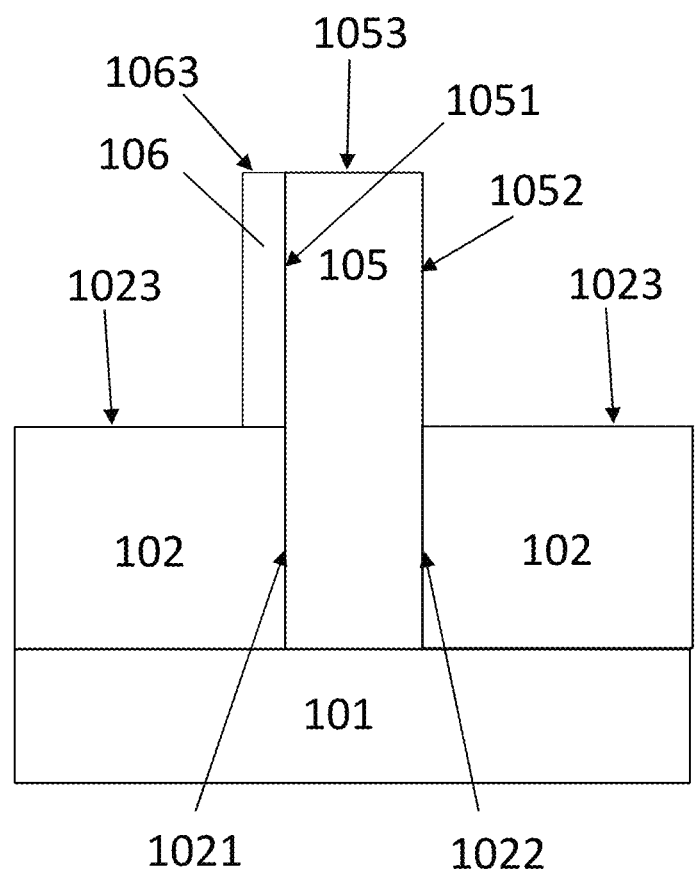
Figure 12:
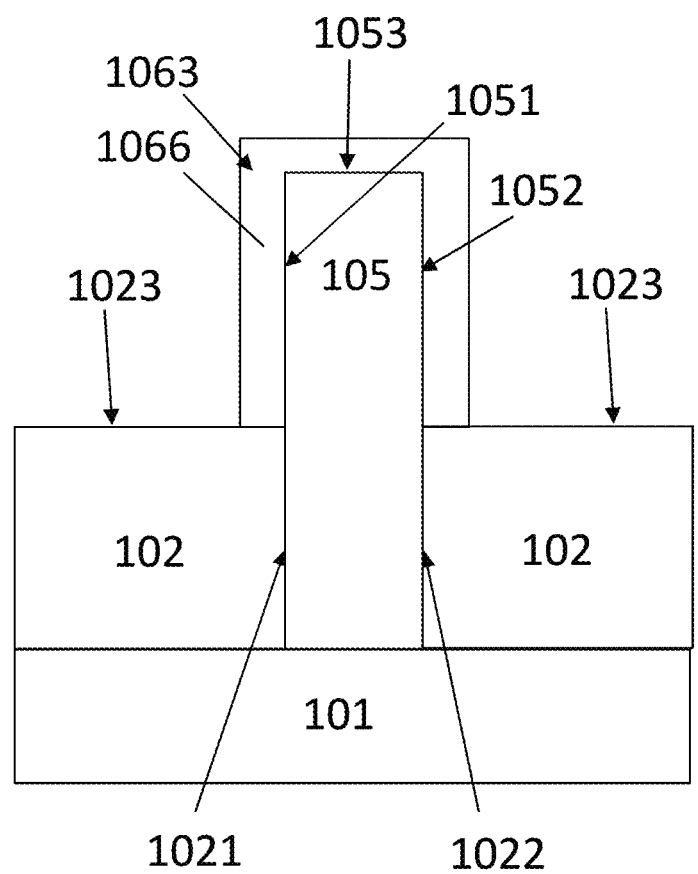
Figure 14:
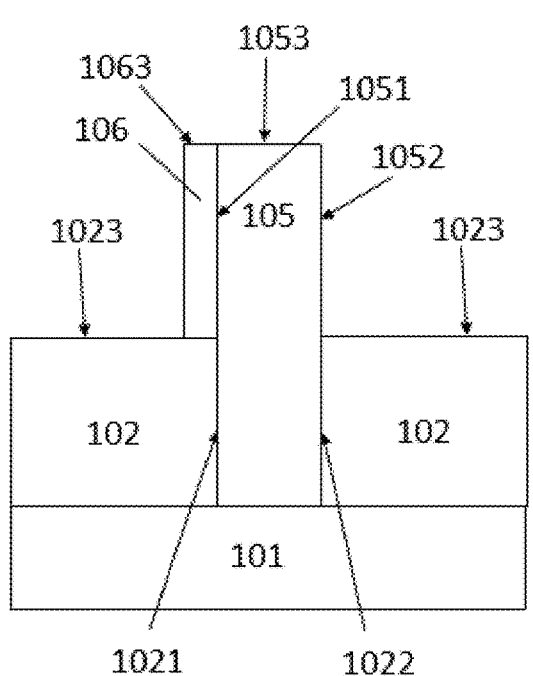

After providing the fin structure 105, a vertical channel layer 106 is provided along and in contact with the first exposed sidewall surface 1051 of the fin structure 105 (FIG. 8). Providing the vertical channel layer 106 may be done by depositing a conformal vertical channel layer 166 over the fin structure 105 and the dielectric layer 102 (as shown in FIG. 12) and thereafter removing that part of the conformal vertical channel layer which is not present at the first sidewall surface 1051 of the fin structure 105 (as shown in FIG. 12A). According to embodiments also another vertical channel layer 110 may be formed by leaving also the vertical channel material present at the other sidewall 1052 of the fin structure 105 (as shown in FIG. 12B). According to embodiments selective area growth of the vertical channel layer may be used such that the channel material 106 is not deposited on the dielectric isolation surface 102. Due to the chosen growth technique of the vertical channel layer 106, the vertical channel layer will most likely not be in contact with the dielectric isolation layer 102, but form a facet corner at the bottom of the fin 105 as shown schematically in FIG. 12C. Also the top surface of the vertical channel layer may not be perfectly horizontal, but may form a facet corner with the top of the fin 105 as shown schematically in FIG. 13.

According to embodiments a dielectric capping layer 111 may be provided on top of the fin structures 105 (as shown in FIG. 8). This has the advantage that lateral growth at the sidewall surface of the fin structure 105 will be enhanced (on a {110} surface) by protecting the top surface of the fin structure 105 (which has a (001) surface). Thereafter growth of the vertical channel material 106 will only occur at the sidewall surfaces or otherwise said only on the {110} surface.

According to embodiments the vertical layer may also remain at the second sidewall surface 1052 thereby forming another vertical channel layer 110 at the opposite side of the fin structure 105 (as shown in FIG. 12B). The another vertical channel layer 110 comprises the same channel material as vertical channel layer 106 in this case.

Figure 15:
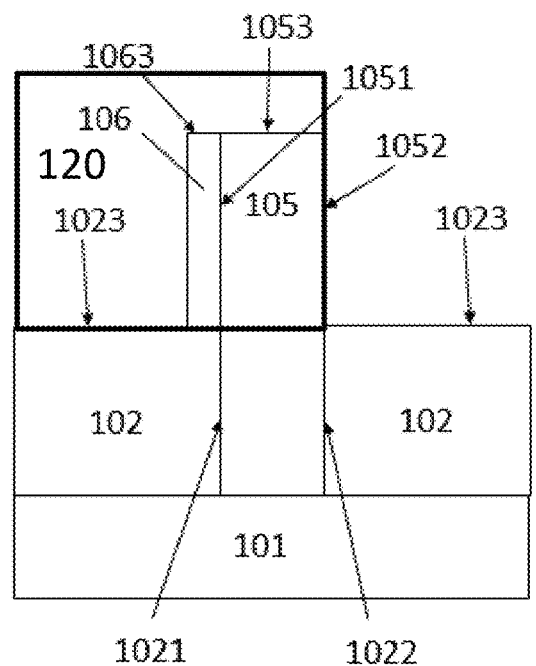
Figure 16:
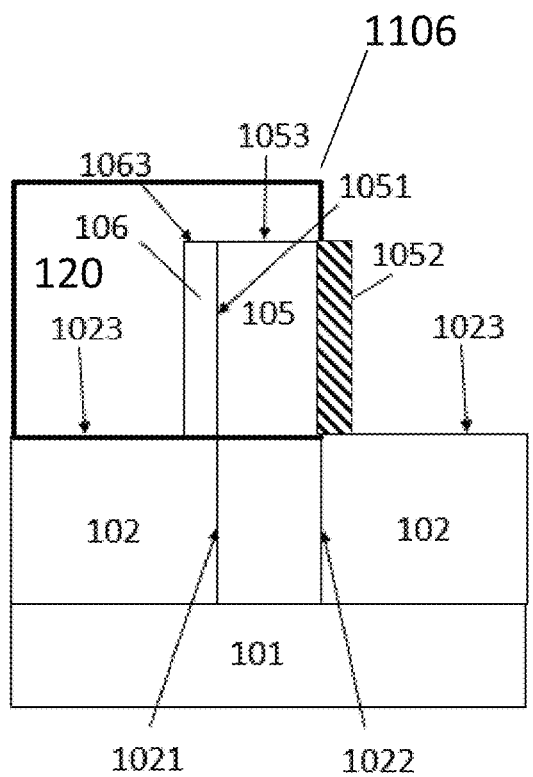
Figure 17:
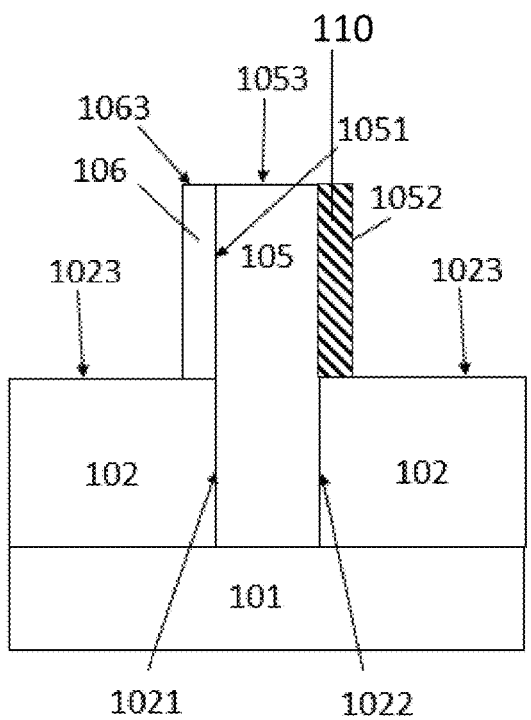

According to embodiments the second vertical channel layer 110 may also be formed with another channel material (being different from the channel material of the first vertical channel layer 106). In this case, after providing the first vertical channel layer 106 (so as shown in FIGS. 14-17), the first vertical channel layer 106 is masked or covered by a masking material 120 (FIG. 14) such that it is protected for a subsequent process step (FIG. 15). After providing a masking material 120 on the first vertical channel layer 106, another conformal channel layer may be formed over the structure (FIG. 16) and etched thereby forming the second vertical channel layer 110 which is in contact and along the second sidewall surface 1052 of the fin structure 105 and which comprises another material than the vertical channel layer 106 (FIG. 17). With conformal is meant the layer is formed with a uniform thickness and following the topography of the underlying structures.

The vertical channel layers 106, 110 preferably comprise a channel material having a lattice mismatch with the fin material as already described above.

The vertical channel layers 106, 110 located at opposite sides of the fin structure 105 may comprise the same channel material or may comprise a different channel material.

The vertical channel layers 106, 110 may have a width being smaller than the width of the fin structure 105.

Figure 5A:
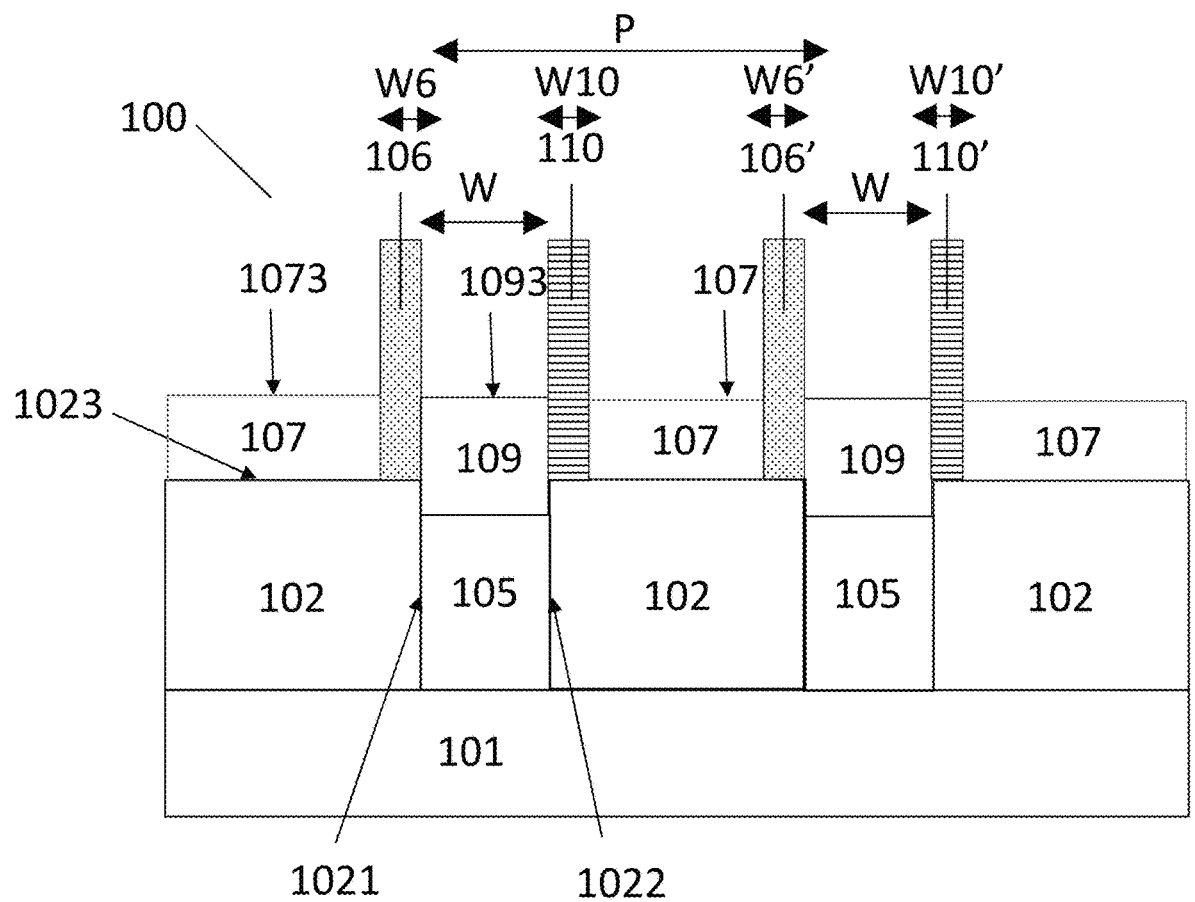
FIG. 5A to 5B schematically illustrates side view and top view of neighboring semiconductor devices comprising a first and a second vertical channel layer according to embodiments of the disclosed technology.
Figure 5B:
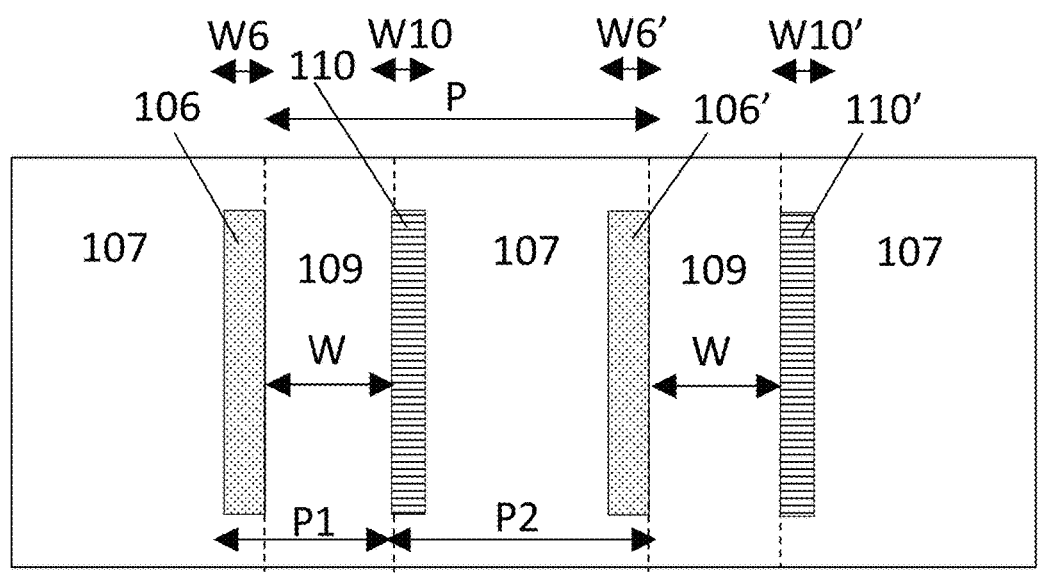

It is an advantage of embodiments of method for manufacturing the semiconductor device according to the disclosed technology that a tight pitch may be achieved, being pitch P1 and/or P2 (as shown in FIG. 5B) in between the vertical channel(s) 106 and the another vertical channel(s) 110. Pitch P1, P2 are much smaller than pitch P in between subsequent fin structures 105. The sum of P1 and P2 is equal to P. In prior art device, the channel layers or active regions are provided in the fin structures located a pitch P from each other. According to the disclosed technology the fin structures 105 are thus sacrificial structures which enable to provide vertical channel layers 106, 110 at a smaller pitch P1 and/or P2 from each other. Pitch P1 is defined by the width of the fin structure 105 and the width of the vertical channel layer 106, 110. Pitch P2 is defined by the distance in between two adjacent fin structures 105.

Figure 9:
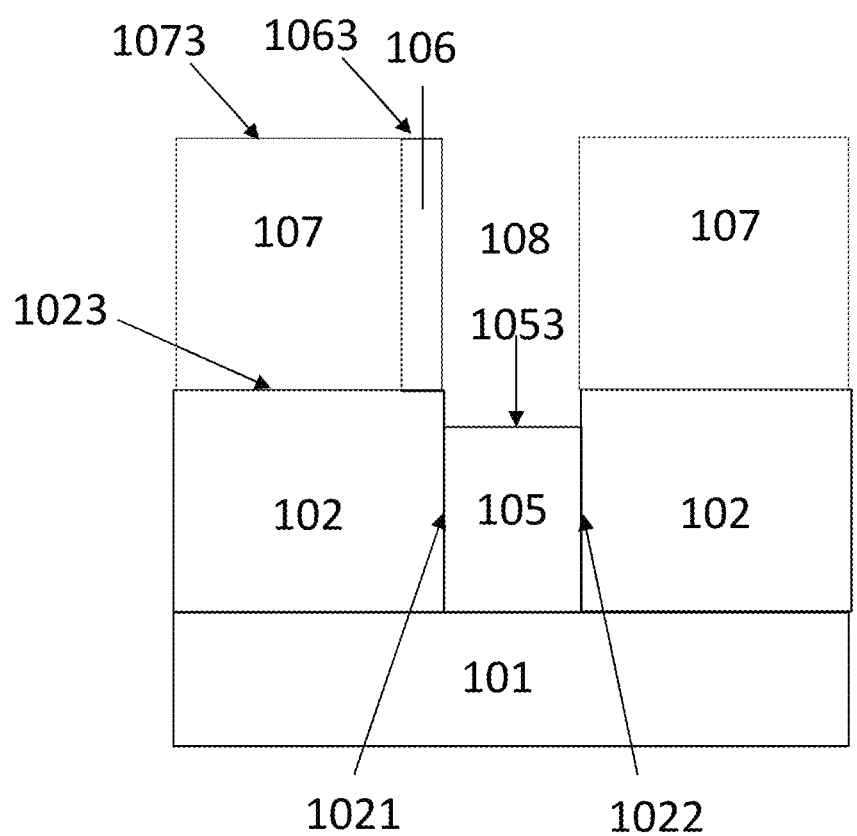

After providing the vertical channel layer(s) 106, 110, a dielectric layer 107 is provided on the exposed dielectric isolation layer 102 in contact with the vertical channel layer(s) 106, 110 (FIG. 9). The dielectric layer 107 has a top surface 1073 being substantially aligned with the top surface 1063 of the first vertical channel layer 106 and/or also with the top surface 1103 of the another vertical channel layer 110. A dielectric layer 107 may thus first be deposited using a deposition technique such as chemical vapor deposition (CVD) or any other know technique for a person skilled in the art and thereafter planarized using for example chemical mechanical polishing (CMP) in order to align all the top surfaces 1073, 1063, 1103.

After providing the dielectric layer 107, part of the fin structure 105 may be removed partially or completely thereby creating a trench 108 (FIG. 9). The fin structure 105 is thus thereby decreased in height and has now a decreased or lowered top surface 1053 (which is also referred to as the bottom surface of the trench) which is lower than the top surface 1023 of the dielectric isolation layer. The fin 105 needs to be removed at least until a level lower than the top surface 1023 of the dielectric isolation layer in order to make sure that the vertical channel layers 106, 110 are electrically isolated from each other. The difference in height between the top surface 1023 of the dielectric isolation layer and the bottom surface 1053 of the trench should be such that no conduction is possible between the vertical channel layer 106 or the another vertical channel layer 110 and the semiconductor substrate 101.

Figure 10:
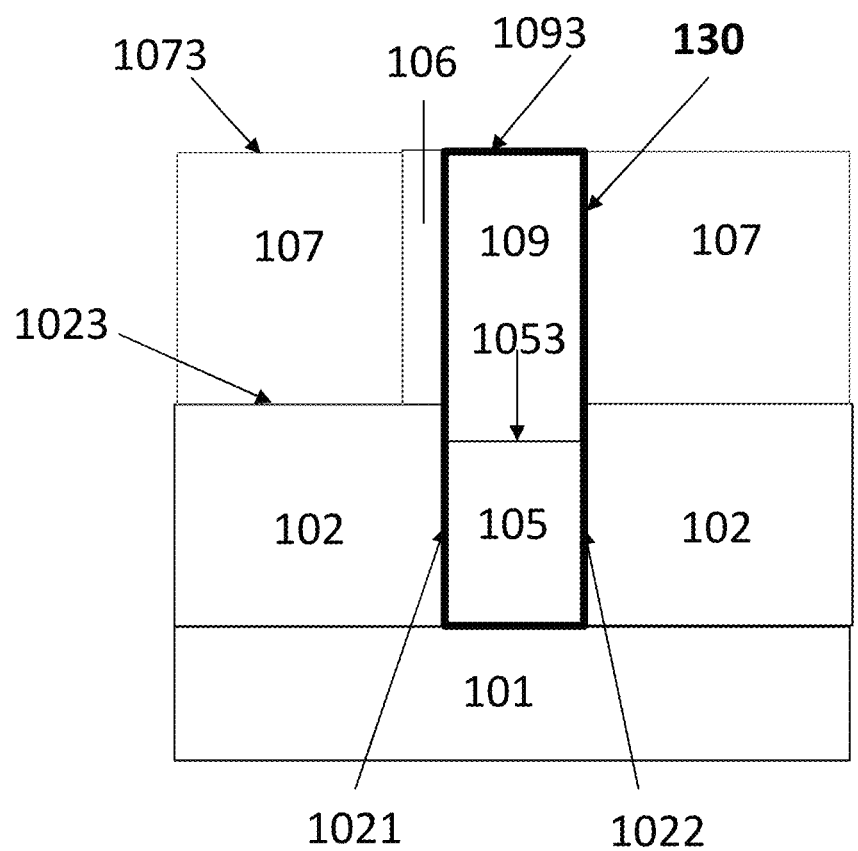

The trench 108 is thereafter filled with a dielectric filling material 109 (as shown in FIG. 10).

The dielectric material of the dielectric layer 107 and the dielectric filling material 109 are preferably the same, but may also be different.

Figure 11:
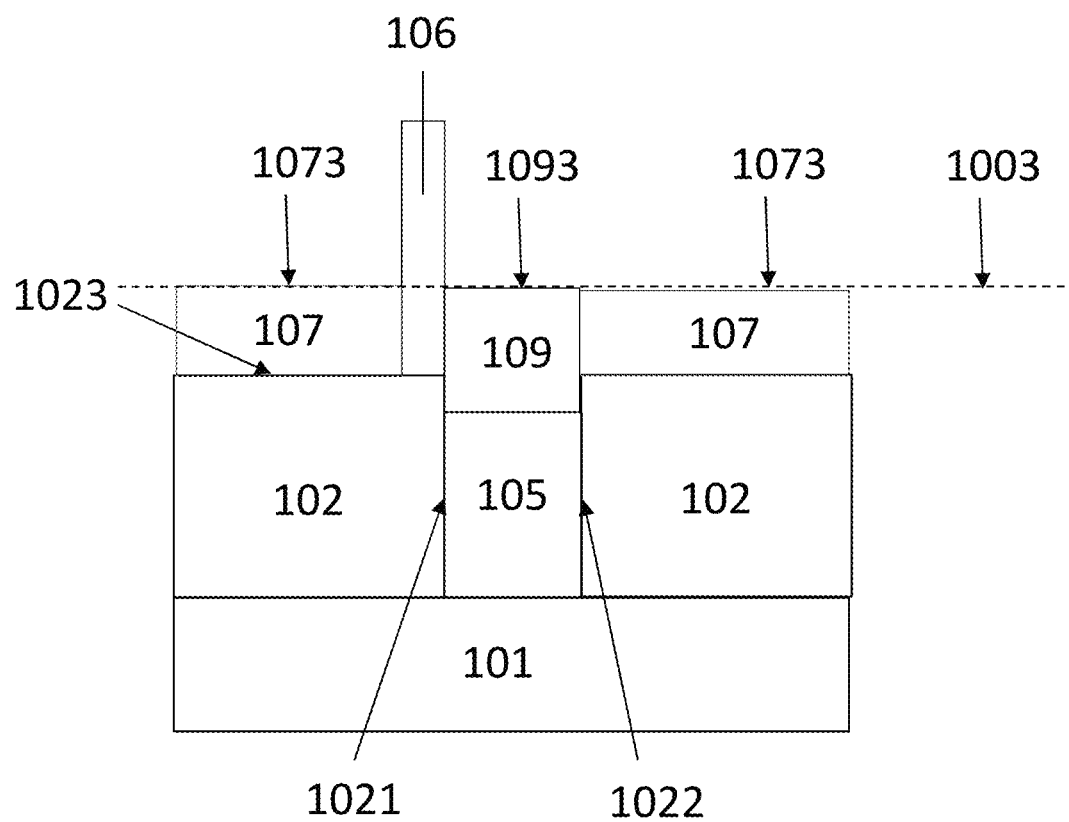

After filling the 108 with the dielectric filling material 109 both top portion of the dielectric filling material 109 and of the dielectric layer 107 are removed such that the top surface 1073 of the dielectric layer 107 becomes substantially planarized with the top surface 1093 of the remaining dielectric filling material 109 (as shown in FIG. 11). The dielectric filling material 109 and the dielectric layer 107 are thus recessed, for example by etching such that the vertical channel layer 106, 110 become freestanding. With freestanding is meant that a top part of the vertical channel layer 106 is standing free without any adjacent layers and thus protruding above the common dielectric surface 1003.

In further processing steps, a gate stack may further be provided around the vertical channel layer thereby forming a vertical field effect transistor (VFET). The vertical channel 106, 110 may be positioned in between a source and a drain region, for example a source region at the bottom of the vertical channel 106 and a drain at opposite side at the top of the vertical channel 106 (so source and drain are positioned along the height H of the channel). Also FinFET-like structures may be formed, which means the source and drain regions are then provided at opposite sides of the vertical channel layers along the length L of the device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
    a semiconductor substrate having formed thereon a dielectric isolation layer having an opening formed therethrough;
    a filling isolation structure having a portion formed in the opening and a portion protruding above the dielectric isolation layer, wherein the filling isolation structure comprises a dielectric filling layer;
    a dielectric layer formed on the dielectric isolation layer, wherein the dielectric layer and the dielectric filling layer have top surfaces that are substantially co-planar to form a common top surface; and
    a first vertical channel layer laterally interposed between and in contact with the dielectric layer and the dielectric filling layer at a first side of the dielectric filling layer, wherein the first vertical channel layer extends above the common top surface.

2. The semiconductor device according to claim 1, wherein the filling isolation structure further comprises a fin structure vertically interposed between the semiconductor substrate and the dielectric filling layer, wherein the fin structure has a top surface that is vertically lower than a top surface of the dielectric isolation layer.

3. The semiconductor device according to claim 1, further comprising a second vertical channel layer laterally interposed between and in contact with the dielectric layer and the dielectric filling layer at a second side of the dielectric filling layer opposite the first side, wherein the second vertical channel layer extends above the common top surface.

4. The semiconductor device according to claim 3, wherein the first vertical channel layer and the second vertical channel layer are lattice mismatched to each other by an amount greater than 0% and less than or equal to 10%.

5. The semiconductor device according to claim 3, wherein one or both of a width of the first vertical channel layer and a width of the second vertical channel layer are smaller than a width of the opening.

6. The semiconductor device according to claim 3, wherein each of the first and second vertical channel layers further comprises a source region for injecting carriers into a respective one of the first and second vertical channel layers, a drain region for receiving carriers from the respective one of the first and second vertical channel layers, and a gate stack configured to control flow of carriers in the respective one of the first and second vertical channel layers.

7. The semiconductor device according to claim 3, wherein one or both of the first vertical channel layer and the second vertical channel layer have lattice constants that are different from a lattice constant of the fin structure by less than or equal to about 5%.

8. The semiconductor device according to claim 3, wherein the first vertical channel layer comprises a different material from the second vertical channel material.

9. The semiconductor device according to claim 3, wherein the first vertical channel layer is doped with a first dopant type, and wherein the second vertical channel layer is doped with a second dopant type opposite the first dopant type.

10. The semiconductor device according to claim 3, wherein the fin, the first vertical channel layer and the second channel layer comprise a combination of materials selected from the group consisting of GaAs/Ge/Ge, GaAs/InGaAs/Ge, InAlSb/InSb/InGaSb, GaP/Si/Si, SiGe/Si/Si and Si/SiGe/SiGe.

11. The semiconductor device according to claim 1, wherein the filling isolation structure further comprises a fin structure vertically interposed between the semiconductor substrate and the dielectric filling layer, wherein the first vertical channel layer does not contact the fin structure, such that an electrical connection to the substrate is not formed therebetween.

12. The semiconductor device according to claim 1, wherein the substrate is not a silicon-on-insulator (SOI) insulator.

13. The semiconductor device according to claim 1, wherein the filling isolation structure further comprises a fin structure vertically interposed between the semiconductor substrate and the dielectric filling layer, wherein the fin structure comprises InP, and wherein the first vertical channel layer comprises InGaAs.

14. The semiconductor device according to claim 1, wherein the filling isolation structure further comprises a fin structure vertically interposed between the semiconductor substrate and the dielectric filling layer, wherein the fin structure comprises GaAs, and wherein the first vertical channel layer comprises Ge.

* * * * *